(12) United States Patent
Nakanishi et al.

(10) Patent No.: US 7,136,594 B2
(45) Date of Patent: Nov. 14, 2006

(54) OPTICAL COMMUNICATION DEVICE

(75) Inventors: Hiromi Nakanishi, Osaka (JP); Yoshiki Kuhara, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 693 days.

(21) Appl. No.: 10/087,948

(22) Filed: Mar. 5, 2002

(65) Prior Publication Data

US 2002/0126356 A1    Sep. 12, 2002

(30) Foreign Application Priority Data

Mar. 6, 2001    (JP) ............................. 2001-061653

(51) Int. Cl.
*H04B 10/00* (2006.01)
*G02B 6/36* (2006.01)

(52) U.S. Cl. ..................... 398/164; 398/135; 385/88

(58) Field of Classification Search ............... 398/164, 398/135; 385/89, 88, 91, 92, 49
See application file for complete search history.

(56) References Cited

U.S. PATENT DOCUMENTS

| | | | |
|---|---|---|---|
| 5,647,042 A * | 7/1997 | Ochiai et al. ................. 385/56 |
| 6,043,550 A * | 3/2000 | Kuhara et al. ............... 257/461 |
| 6,317,242 B1 * | 11/2001 | Ozeki et al. ................. 398/164 |
| 6,411,854 B1 * | 6/2002 | Tziviskos et al. ............. 607/57 |
| 6,527,458 B1 * | 3/2003 | Kim ............................. 385/89 |
| 6,565,267 B1 * | 5/2003 | Abe et al. ..................... 385/88 |
| 6,712,528 B1 * | 3/2004 | Galeotti et al. ............... 385/91 |

FOREIGN PATENT DOCUMENTS

JP    7-106608    4/1995

OTHER PUBLICATIONS

Proceedings of the 1999 Communications Society Conference of IEICE, B-10-112, Sep. 7-10, 1999, p. 289 and its English translation.
Proceedings of the 1999 General Conference of IEICE, C-3-10, Mar. 25-28, 1999, p. 164 and its English translation.
Proceedings of the 1998 General Conference if IEICE, C-3-7, Mar. 27-30, 1998, p. 173 and its English translation.

* cited by examiner

*Primary Examiner*—Jason Chan
*Assistant Examiner*—Quan-Zhen Wang
(74) *Attorney, Agent, or Firm*—Smith, Gambrell & Russell, LLP

(57) ABSTRACT

An optical communication device including optoelectronic (LD, PD, LD/PD) elements allocated to a top surface of a circuit board and electronic, electric elements (IC, R/C) allocated to a bottom surface and to the top surface of the circuit board.

17 Claims, 8 Drawing Sheets

Embodiment 1, 2

Fig.3 PRIOR ART
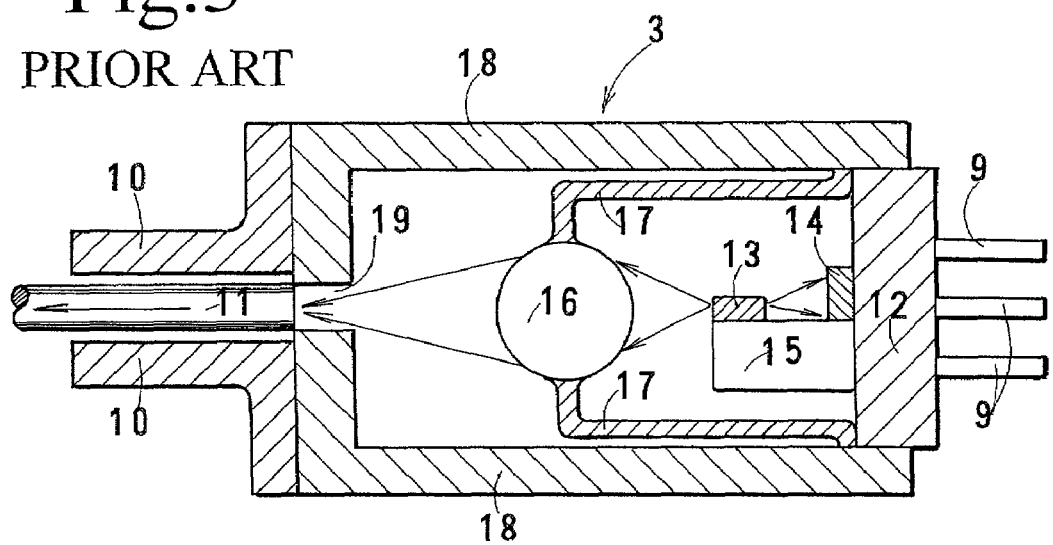
Fig.4 Embodiment 1,2
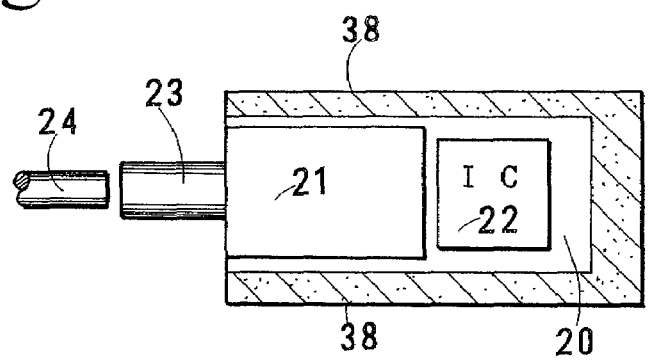
Fig.5 Embodiment 1, 2
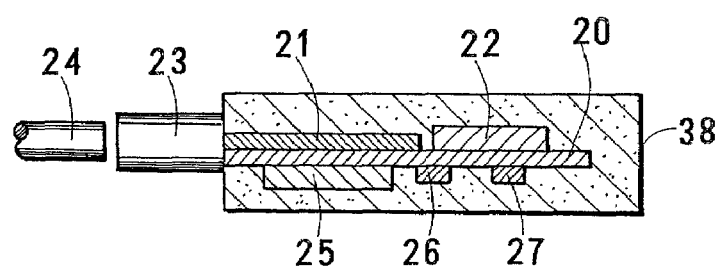

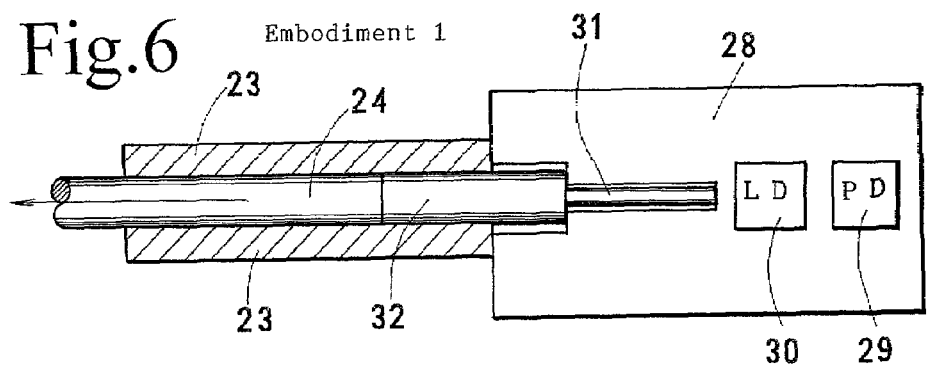
Fig.6 Embodiment 1
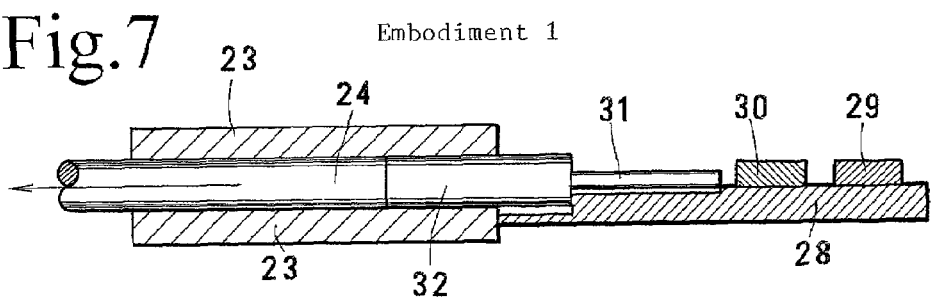
Fig.7 Embodiment 1
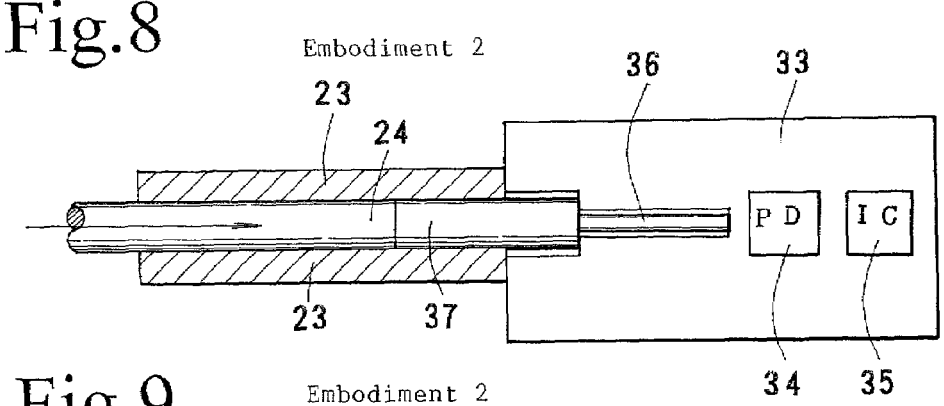
Fig.8 Embodiment 2
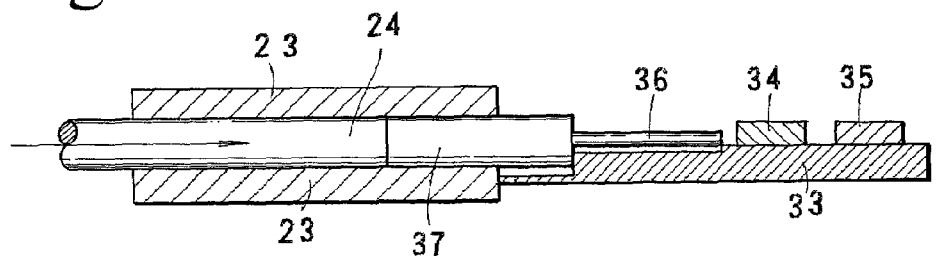
Fig.9 Embodiment 2

Fig.10  Embodiment 3
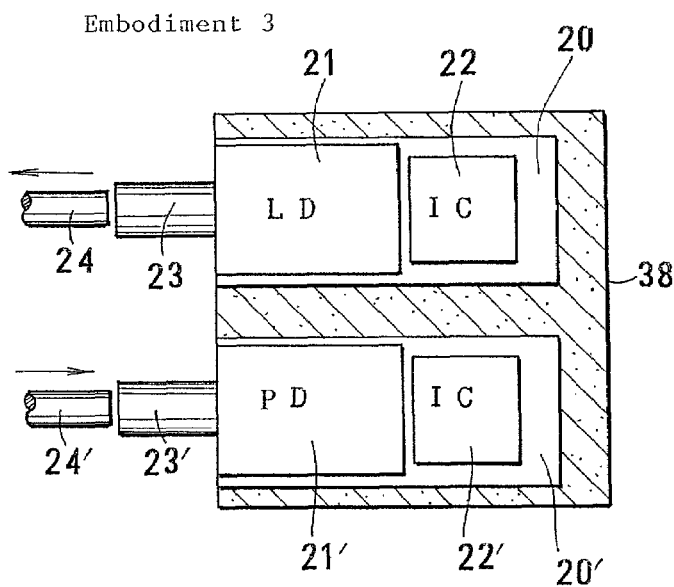
Fig.11
PRIOR ART
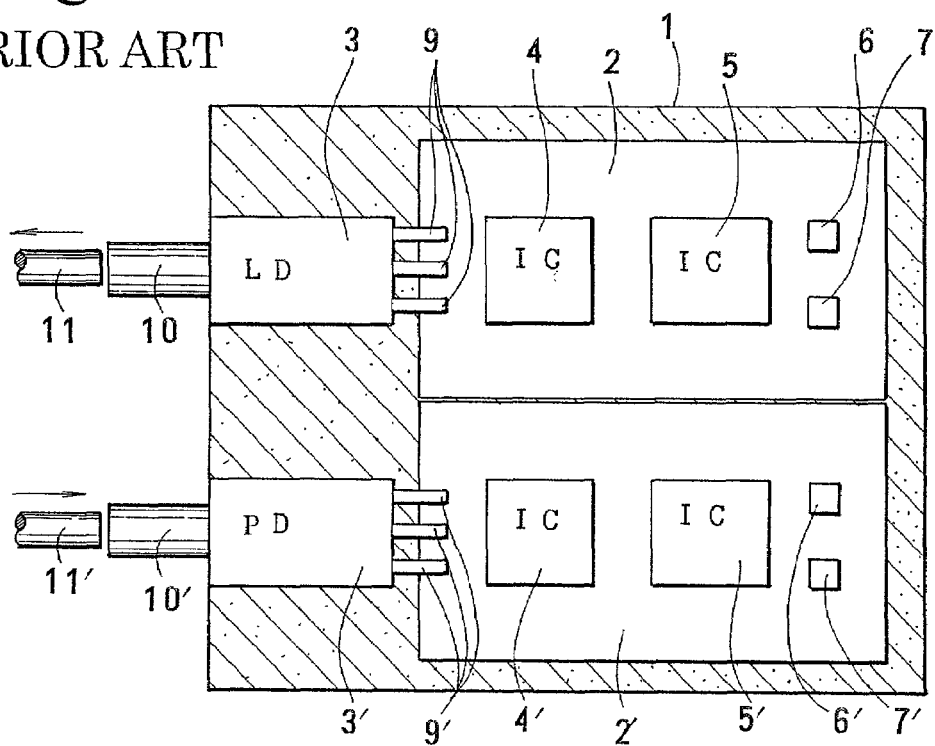

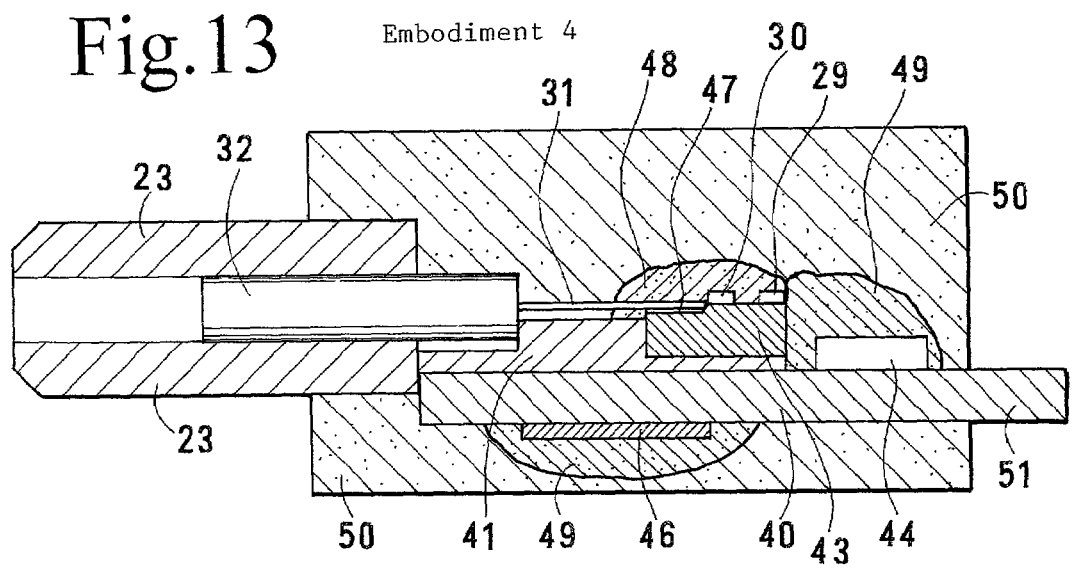
Fig.13 Embodiment 4
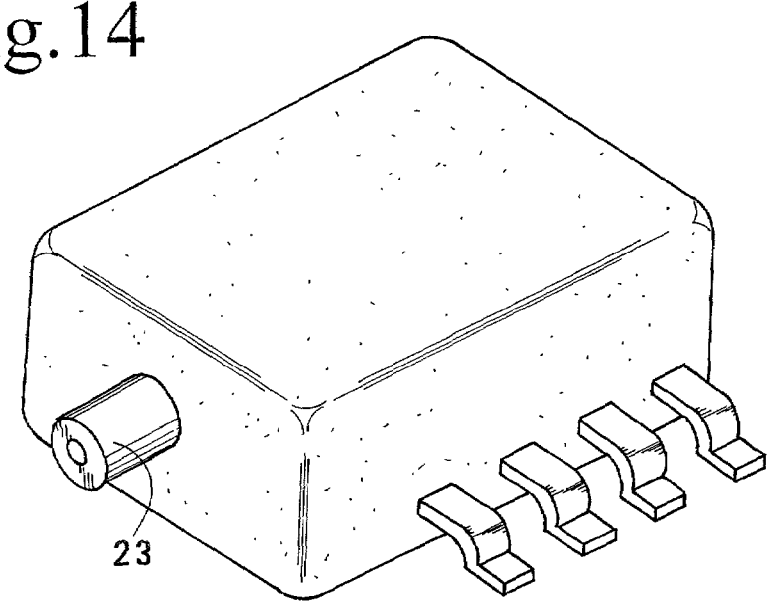
Fig.14 Embodiment 4

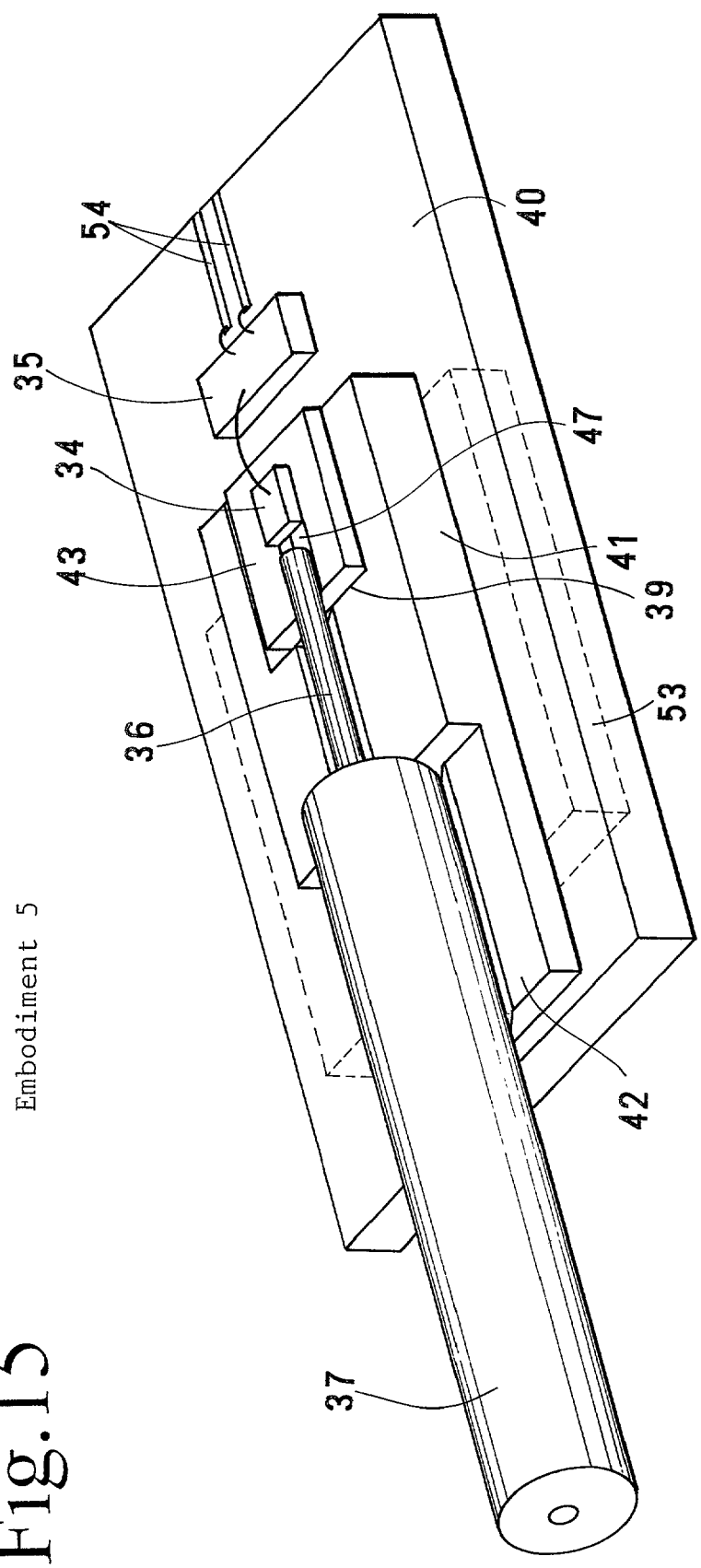
Fig.15 Embodiment 5

Embodiment 6

OPTICAL COMMUNICATION DEVICE

BACKGROUND OF THE INVENTION

1. Field of the Invention

This invention relates to an optical communication device, that is, an optical transmitting device (LD, LED module), an optical receiving device (PD module) and transmitting/receiving device (LD/PD module). This invention aims at a small-sized, inexpensive optical communication device which makes the best use of the planar waveguide circuit (PLC) technology for photodiodes (PD) and laser diodes (LD) (or LED) including peripheral electronic devices.

This application claims the priority of Japanese Patent Application No.2001-61653 filed on Mar. 6, 2001 which is incorporated herein by reference.

2. Description of Related Art

FIG. 1 and FIG. 2 show the known optical communication device stored in a plastic (resin) mold type package. The resin package 1 includes a printed circuit board 2, an optical module 3, a first integrated circuit chip (IC) 4, a second integrated circuit chip (IC) 5, and R/C elements which are either resistors (R) or capacitors (C). The circuit board 2 is a planar resin board (e.g., epoxy resin) printed with wiring patterns having holes. Pins of the ICs 4 and 5 and pins of the R/C elements are inserted and fixed in the holes of the wiring patterns on the printed circuit board 2. The optical module 3 has a package, a set of pins 9 at the back and a receptacle 10 at the front. The package includes at least one optoelectronic device, that is, a photodiode (PD), a laser diode (LD) or a light emitting diode (LED).

When the optical communication device is a transmitting device, the optical module 3 includes an LD or an LED. The LD or LED is a light source which emits transmitting signal light. The IC 4 and the IC 5 are driving ICs which amplify transmitting signals and give driving current to the LD or the LED.

When the optical communication device is a receiving device, the optical module 3 includes a PD or an APD which converts light signals to electric current signals (photocurrent). The IC 4 and the IC 5 are preamplifiers which amplify the photocurrent. In FIG. 1 and 2, the device has a resin molded type package 8. Instead of the resin mold, the device is sometimes stored in a case package which is either a metallic case or a ceramic case having outer walls and an inner space. The case is hermetically sealed.

The known structure of FIG. 1 and FIG. 2 was proposed, for example, by

① Japanese Patent Laying Open No.7-106608(106608/ '95), "Optical Receiver".

The optical module 3 is an independent device sealed in a metallic package in the Prior Art of FIG. 1 and FIG. 2. Ends of the pins of the module 3 are soldered to wiring patterns on the print circuit board 2. The optical module 3, the circuit board 2, and the ICs 4 and 5 are stored in the metallic package 1. The metallic package 1 has leadpins (not shown). The cylindrical receptacle 10 protrudes from the front of the optical module 3. An end of an optical fiber 11 is inserted to the receptacle 10. The optical fiber 11 connects this unit with a partner optical communication unit. In the case of the receiving device, the optical signals propagating from the partner are received by a PD in the module 3. In the case of the transmitting device, an LD injects transmitting signals in the optical fiber 11.

FIG. 3 is an enlarged sectional view of the optoelectronic module 3 in the transmitting/receiving device shown in FIG. 1 and FIG. 2. The optoelectronic module 3 is an independent device having several elements which are stored in a metallic package. A metallic disc stem 12 has a projection 15 standing on a top surface. The projection 15 supports a laser diode (LD) 13 on an inner side. The laser diode emits forward light and rear light. A photodiode 14 is mounted at the center of the stem 12 just below the LD 13 for monitoring the power of the rear-emitted LD light. A cylindrical cap 17 is fitted upon the stem 12. The cylindrical cap 17 has a ball lens 16 at a top opening for converging the light emitted forward from the LD 13. A cylindrical metallic sleeve 18 with a top opening retains the stem 12, the PD 14, the LD 13, the lens 16 and the cap 17.

The forward-emitted LD light rays are converged by the lens 16 at an end of an optical fiber 11 and are introduced into the fiber 11 as signal light. The rear-emitted LD light are irradiated to the monitoring PD 14. Lead pins 9 protrude from the bottom of the stem 12 for introducing driving current to the LD 13, for applying reverse bias to the monitoring PD 14 and for outputting monitoring signal from the PD 14. The metallic sleeve 18 and the metallic stem 12 seal the inner space hermetically.

Paring and storing the known LD module and PD module of FIGS. 1 and 2 into a package give the Prior Art of an LD/PD module which is shown in FIG. 11. A transmitting (LD) portion is constructed by soldering pins 9 of a metallic-packaged LD 3, pins of an LD driving IC 4, pins of an APC-IC 5, and pins of R/C elements 6 and 7 to wiring patterns prepared upon a first print circuit board 2. Since the printed patterns convey electric currents, the LD part dispenses with a bonding-wire. A receptacle 10 is attached to a front end of the metallic-packaged LD 3.

A receiving portion is built by soldering pins 9' of a metallic-cased PD 3', pins of a main amplifier IC 4', pins of a waveform-reforming IC, pins of a timing-adjusting IC, pins of a buffer IC, and pins of R/C elements 6' and 7' to wiring patterns made upon a second print circuit board 2'. The printed patterns carrying currents expel bonding-wires from the PD part. A receptacle 10' is upholstered to a front of the metallic-cased PD 3'. A large, wide package 1 encloses the PD part and the LD part arranged in parallel side by side. An optical fiber 11' is joined to the receptacle 10' of the PD part for taking in receiving signal light propagating in the fiber. The LD/PD module of FIG. 11 is too long, too wide and too thick. This known module is overall too large in three directions.

② Susumu Nakaya, "MU interface compact 155 Mb/s 3R-optical transceiver module", Proceedings of the 1999 Communications Society Conference of IEICE, B-10-112, p289, proposed a module having a transmitting part and a receiving part in parallel. The transmitting part consists of a receptacle, an LD and a circuit board with ICs. The receiving part consists of a receptacle, a PD and another circuit board with ICs.

③ M. Shishikura, T. Hirataka, K. Yoshida, K. Tatsuno, and S. Tsuji, "Plastic Mini-DIL PIN-PREAMP modules using low capacitance Si optical-bench", Proceedings of the 1999 Communications Society Conference of IEICE General Conference, C-3-10, p164, proposed a receiving module (PD module) having an optical bench (substrate), a PD and an IC mounted on a rear half of the optical bench and an optical fiber fitted on a front half of the optical bench. The optical bench, the optical fiber, the PD and the IC are accommodated in a resin-molded package. The inner space of the plastic package is filled with resins. This is described here as an example of the Prior Art of the PLC (planar lightguide circuit) type modules.

④ H. Hotta, T. Nakamura, K. Naitou, T. Sakai, Y. Tashita, H. Arimoto, Z. Sekine, and M. Sudou, "Surface mount type high power LD module", Proceedings of the 1998 IEICE General Conference, C-3-7, p173, proposed an LD module having a silicon bench, an optical fiber provided upon the silicon bench, an LD and a monitoring PD mounted upon the silicon bench and a resin-molding package enclosing the silicon bench, the LD, the PD and the fiber. This LD module lacks ICs and electronic circuits. This is cited here as another example of the Prior Art of the PLC type modules.

The transmitting/receiving module shown in FIG. 1 and FIG. 2 proposed by ① and ② stores an LD into a metallic package and a PD into another metallic package. The metallic packages have large volumes as shown in FIG. 3. The metallic packaged LD and PD are accompanied by electronic circuits (LD driving ICs, amplifier ICs and so on) furnished on epoxy resin print circuit boards. The module is long, thick and bulky. The module requires many numbers of parts. Such an LD module or a PD module is unfavorable for reducing cost and size.

The PLC has a strong point of reducing the thickness of modules, since the PLC disposes a laser diode or a photodiode on a silicon bench and attaches an optical fiber to the silicon bench for aligning the PD or the LD, which is called passive alignment. Prior Art ④ is an example of an LD module which loads an LD on a silicon bench, aligns an optical fiber in a groove on the same silicon bench and encloses the sample into a plastic package.

Prior Art ③ is an example of a PD module which loads a PD on a silicon bench, aligns an optical fiber in a groove on the same silicon bench and encloses the sample into a plastic package.

Prior Art ④ and ③ contain neither electronic elements (preamplifier IC, LD-driving IC, amplifier IC, waveform-reshaping IC, buffer IC, auto power controlling IC etc.) nor electric elements (R/C elements; namely resistor R, capacitor C, inductance L). The electronic elements and electric elements have been loaded upon an independent, separated circuit board succeeding to the optoelectronic (LD, PD, LD/PD) module as demonstrated by FIG. 1 and FIG. 2. The optoelectronic (LD, PD, LD/PD) module 3 has long leadpins 9 on the bottom. Soldering the leadpins to wiring patterns on the circuit board 2 allows the optoelectronic module electrical connection to electronic elements or electric elements on the circuit board 2.

Thus, if the metallic packaged optoelectronic (LD, PD, LD/PD) module 3 of FIGS. 1 and 2 is replaced by a PLC type optoelectronic (LD, PD, LD/PD) module, the module length is scarcely shortened. Blunt replacement of the metal packaged module by the PLC module is insignificant. Peripheral electronic or electric elements which accomplish the function of the modules should be taken into account.

Sizing down of unified modules including electronic elements is important.

One purpose of the present invention is to provide a downsized optical communication device (optoelectronic elements (LD, PD, LD/PD) and electric, electronic elements) having a short length, a small width and a thin thickness.

Another purpose of the present invention is to provide a low cost optical communication device (optoelectronic elements (LD, PD, LD/PD) and electric, electronic elements) by reducing the number of necessary parts and simplifying assembling steps.

A further purpose of the present invention is to provide a high-speed optical communication device (optoelectronic elements (LD, PD, LD/PD) and electric, electronic elements) by shortening wiring distances between optoelectronic elements and electronic elements.

SUMMARY OF THE INVENTION

The present invention proposes an optical communication device allocating mainly optoelectronic elements to a top surface of a circuit board and electronic or electric elements to a bottom surface of the circuit board. An extra space of the top surface can be allotted to other electronic or electric elements.

The gist of the present invention is shown by, top surface=optoelectronic elements+electronic, electric elements bottom surface=electronic, electric elements The planar lightguide circuit (PLC) type module requires a flat board as a base. The known PLC modules have used only the top surface of the board but have left the bottom surface unused. The present invention makes the best use of the bottom surface of the board as a space for mounting electronic, electric elements. Exploitation of the bottom of the board features the present invention.

Leadpins are fitted to either the top wiring patterns on the top surface or the bottom wiring patterns on the bottom surface. Vertical throughholes piercing the board connect the top wiring patterns on the top surface to the bottom wiring patterns on the bottom surface.

Otherwise, a two-storied leadpin structure is effective, since the board has two sets of wiring patterns on both surfaces. The two-storied leadpin structure allots an upper set of leadpins to the top wiring metallized patterns on the top and allots a lower set of leadpins to the bottom wiring metallized patterns on the bottom. If a submount with other wiring patterns is laid upon the board, a three-storied leadpin structure is available by allocating a third set of leadpins to the submount wiring patterns. The two-storied or three-storied leadpin structure has an advantage of increasing the number of available leadpins and another advantage of eliminating the throughholes.

The present invention succeeds in sizing down of modules, since some electronic, electric elements are mounted on the bottom of the board. The length of the module is reduced to about half of the Prior Art as shown in FIGS. 1, 2 and 3. The size-reduction cuts down cost. Low-cost is one advantage of the present invention.

Exploitation of the bottom enables the optical communication module to increase the number of loadable electronic, electric elements. The increment of loadable elements allows the module to transplant the complementary electronic, electric elements from a remotely distanced external space onto the board within the module. Access of the elements allows to connect the optoelectronic elements to the complementary electronic, electric elements by short wires. Shortening of wiring improves high speed performance through reductions of an inductance L and a resistance R of wiring. The short wires shield the module from noise. The Prior Art has been annoyed by floating capacitance, stray inductance, noise inducement and strong AC resistance accompanying long wirings. The present invention realizes high speed optical communications of 2.5 Gbps or 5 Gbps. At the best condition, 10 Gbps of transmission is available. Improvement of high frequency performance is another advantage of the present invention. Shortening of wiring decreases the possibility of malfunction, which raises reliability. Enhancement of reliability is another advantage of the present invention.

Variations of the present invention are preliminarily described.

[Kinds of Applicable Optical Communication Devices]

This invention can be applied to a transmitting (LD) module, a receiving (PD) module and a transmitting/receiving (LD/PD) module.

[Kinds of Optoelectronic Elements]

The optical communication device has a bench with a top surface and a bottom surface and an optical device mounted upon the top surface of the bench. The optical device includes signal propagation media and optoelectronic elements. The signal propagation media are optical fibers and light waveguides. The optoelectronic elements are an LD (laser diode), an LED (light emitting diode) or a monitoring PD for a transmitting module. The optoelectronic elements are a PD (photodiode) or an APD (avalanche photodiode) for a receiving module.

[Kinds of Electronic Elements]

This invention sometimes mounts electronic elements on the bottom of the bench. The electronic elements are a driving IC for amplifying sending signal current and giving the current to the LD and a regulating IC which adjusts an average level of the LD current as operation of the output of the monitoring PD for a transmitting (LD) module. The electronic elements are a preamplifier for amplifying photocurrent of the PD and a processing IC for binarizing or demodulating the amplified photocurrent. Capacitors for stabilizing the source voltage, RC filters or LRC filters for eliminating noise are electronic elements common to the transmitting module and the receiving module. [Kinds of Applicable Boards]

Since this invention allocates both surfaces of a board with optoelectronic elements and electronic elements, the board is indispensable for the present invention. The board should have flat and insulated surfaces. Plastic boards are favorable to the boards due to low cost. For example, epoxy resin boards are preferable owing to low cost, insulation and strength. Liquid crystal polymers are also available for the material of the boards. Silicon single crystal is a candidate for a board. But the use of costly silicon raises cost. The main board has metallized patterns on the top surface and the bottom surface. Then, the main board is called a "print circuit board" or "circuit board" for discriminating other categories of plates.

[Submount]

This invention sometimes makes use of a submount between the circuit board and the optical bench. The employment of the submount reduces a necessary volume of a high cost optical bench. The submount can be made by a material cheaper than the bench. A liquid crystal polymer submount is preferable. Basic support has a three layered structure of bench/submount/board, if the submount is adopted. Without submount, the basic support has a two layered structure of bench/board.

[Optical Bench]

This invention employs an optical bench for passive alignment between a light guide and an optoelectronic chip. A single crystal silicon bench is preferable to the optical bench. A ceramic bench is another candidate for the optical bench. A resin bench is also available.

A silicon single crystal plate is the best candidate for the bench. The silicon single crystals bench enables anisotropic etching to form V-grooves for embedding optical fibers. Sputtering or CVD can make $SiO_2$ light waveguides with a core and a cladding on the silicon bench. Another candidate for the optical bench is a ceramic plate, for example, alumina ($Al_2O_3$). The ceramic bench excels in insulation between the top and the bottom. A third candidate for the optical bench is a plastic plate. The plastic bench allows plastic molding to form the V-grooves for fixing the fibers and the steps for mounting optoelectronic elements at a stretch. A further candidate is a metal plate provided with insulating films on a top and a bottom. [Wiring Patterns]

The top surface and the bottom surface of the print circuit board have wiring metallized patterns. The wiring patterns are made by evaporating or CVD-coating a copper (Cu) film, a aluminum (Al) film or a golden (Au) film on the board, selectively etching the film through a mask resist by photolithography. The wiring patterns can be simply made by printing Cu, Al or Au paste.

BRIEF DESCRIPTION OF THE DRAWINGS

FIG. 3 is a vertical section of the metallic-cased optoelectronic element which is a component of the known device shown in FIGS. 1 and 2.

FIG. 4 is a horizontally sectioned view of Embodiments 1 and 2 as an optical communication device (LD module or PD module).

FIG. 5 is a vertically sectioned view of Embodiments 1 and 2 as an optical communication device (LD module or PD module).

FIG. 6 is a plan view of an LD element of Embodiment 1 (LD module).

FIG. 7 is a vertically sectioned view of the LD element of Embodiment 1.

FIG. 8 is a plan view of a PD element of Embodiment 2 (PD module).

FIG. 9 is a vertically sectioned view of the PD element of Embodiment 2.

FIG. 10 is a plan view of Embodiment 3 (LD/PD module) which features a short length.

FIG. 11 is a plan view of another known LD/PD module having printed circuit boards, metallic LD- and PD-elements, complementary ICs and R/C elements, which has a large length and a broad width.

FIG. 13 is a vertically sectioned view of completed Embodiment 4 having a circuit board with a top metallized surface and a bottom metallized surface, a submount having double V-grooves and being laid upon the circuit board, a silicon bench having a narrow V-groove and being loaded upon the submount, a ferrule imbedded in the V-groove of the submount, a fiber imbedded in the V-grooves of the submount and the silicon bench, an LD mounted upon the silicon bench, a monitoring PD lying behind the LD upon the silicon bench, an LD driving IC fitted upon the top of the circuit board, an APC-IC fitted upon the bottom of the circuit board, a transparent resin covering optical paths, a protecting resin enclosing the LD driving IC and the APC-IC, and a package encapsulating the circuit board, the bench and other elements.

FIG. 14 is an oblique view of completed Embodiment 4 enclosed by a plastic package from which leadpins project sidewards and a ferrule protrudes forward.

FIG. 15 is a perspective view of half-fabricated Embodiment 5 (PD module) having a circuit board with a top metallized surface and a bottom metallized surface, a submount having double V-grooves and being laid upon the circuit board, a silicon bench having a narrow V-groove and being loaded upon the submount, a ferrule imbedded in the V-groove of the submount, a fiber imbedded in the V-grooves of the submount and the silicon bench, a PD mounted upon the silicon bench, a preamplifier IC laid at the back of the PD upon the top of the circuit board, and a main amplifier IC, a waveform-reforming IC, a timing adjusting IC fitted upon the bottom of the circuit board.

DETAILED DESCRIPTION OF THE PREFERRED EMBODIMENTS

Figure 1:
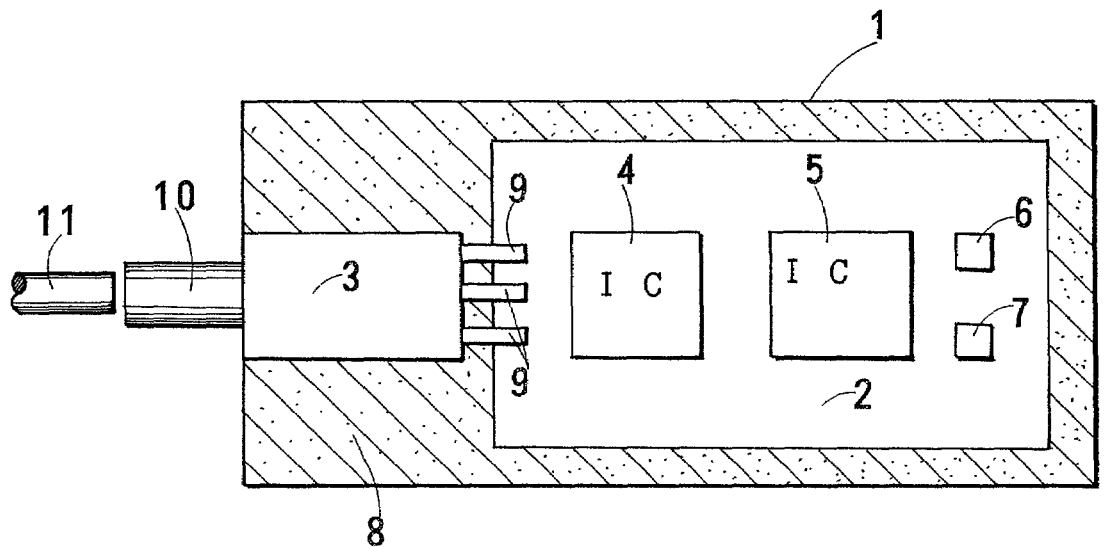
FIG. 1 is a plan view of the known optical communication device produced by mounting a metallic-cased optoelectronic element, ICs, R/C elements on a print circuit board by soldering, and storing the circuit board with the parts in a package.

[Embodiment 1; Transmitting Module (LD Module); FIG. 4, FIG. 5, FIG. 6, FIG. 7]

This invention can be applied to a transmitting (LD) module, a receiving (PD) module and a transmitting/receiving (LD/PD) module. Embodiment 1 is a transmitting (LD) module. FIG. 4 is a horizontally sectioned view of Embodiment 1. FIG. 5 is a vertically sectioned view. Embodiment 1 has a circuit board 20, an optoelectronic element 21, a first IC 22 mounted in series upon a top surface of the circuit board 20, a second IC 25 and R/C elements 26 and 27 mounted on a bottom surface of the circuit board 20, a receptacle 23, and a plastic molding package 38. The plastic package 38 encloses the circuit board 20, the ICs 22 and 25, the R/C elements 26 and 27, and the optoelectronic element 21. The receptacle 23 with an axial opening is fitted at a front end of the circuit board 20. An end of an optical fiber 24 can be inserted into the receptacle 23.

The optoelectronic element 21 contains a set of a laser diode (LD) and a monitoring photodiode (PD). The LD makes signal light pulses from electric signal pulses. The monitoring PD senses rear emitted light power of the LD. The IC 22 is an LD driving IC which amplifies transmitting electric signal pulses and gives the LD the amplified electric signal pulses. Since the driving IC 22 is stored in the same package as the LD, an electrode of the driving IC 22 can be directly connected to an electrode of the LD 21 by a short Au (golden) wire. The access of the driving IC 22 to the LD 21 ensures high speed operation for the LD and enables the LD to generate signal pulses of a good shape without distortion.

The second IC 25 is an auto power controlling (APC) IC for adjusting the average level of the driving current given by the driving IC 22 to the LD 21 by taking account of the average of the photocurrent of the monitoring PD. Since the APC-IC 25 is stored in the same package as the LD, electrodes of the APC-IC can be connected to electrodes of the LD driving IC with short wires. The access of the APC-IC 25 to the driving IC 22 and the LD 21 ensures high noise resistance and compact arrangement of the elements for the LD module.

FIG. 6 and FIG. 7 are an enlarged horizontal view and a vertical section of the optoelectronic (LD) element of Embodiment 1. As mentioned before, the optoelectronic element 21 includes an LD 30 and a monitoring PD 29. A silicon single crystal bench 28 is employed as a base of the optoelectronic elements. The Si bench 28 as a base only for the optoelectronic elements should not be confused with the circuit board 20 as a base for the whole of the module. The bench 28 is a (100) silicon single crystal. Anisotropic chemical etching forms a bigger V-groove and a smaller V-groove in series along the center line on the silicon bench 28. Marks are made by photolithography at the points at which the LD 30 and the PD 29 should be attached. The marks and the V-grooves ensure exact coupling between the fiber and the LD, which is called "passive alignment". Wiring metallized patterns are made upon the silicon bench 28 by printing, evaporation or sputtering. The LD 30 and the monitoring PD 29 are mounted at the marked points on the Si bench 28 along an extension of the V-grooves.

An end of an optical fiber 31 is inserted into a ferrule 32. The ferrule 32 and the fiber 31 are embedded in the larger V-groove and the smaller V-groove on the Si bench 28 respectively. The optoelectronic element 21 containing the Si bench 28, the LD 30, the PD 29, the fiber 31 and the ferrule 32 is attached to a front part of the top surface of the circuit board 20. The LD 30 emits light in both directions. Forward LD light goes into the fiber 31. Rear LD light enters the monitoring PD 29. The PD is either a front end incidence type or a bottom incidence type. In the case of the front end incidence type PD, the rear LD light directly goes into the front end of the PD 29. In the case of the bottom incidence type PD, an intermediate groove (not shown in the figures) with a slanting reflecting wall at an end is dug between the LD 30 and the PD 29. The rear LD light is reflected by the slanting reflecting wall and is introduced via the bottom to the PD 29. The plastic case 38 made by plastic molding encloses the circuit board 20, the optoelectronic element 21, the ICs 22 and 25, and the R/C elements 26 and 27. The inner space of the case 38 can be filled with an inert gas or a resin. This embodiment has a resin-filled case. The receptacle 23 fitted on the front of the case 38 receives an end of the fiber 24.

[Embodiment 2; Receiving Module (PD Module); FIG. 4, FIG. 5, FIG. 8, FIG. 9]

Embodiment 2 is an example of receiving (PD) modules. FIG. 4 and FIG. 5 show horizontally and vertically sectioned views of Embodiment 2. The figures are common to Embodiments 1 and 2. But substances of the optoelectronic element 21 and the ICs 22 and 25 are different. Like Embodiment 1, Embodiment 2 has a circuit board 20 with a top surface and a bottom surface with metallized patterns. An optoelectronic element 21 and a first IC 22 are loaded serially upon the top surface of the circuit board 20. A second IC 25 and R/C elements 26 and 27 are fitted on a bottom surface of the circuit board 20. A plastic case 38 encloses the circuit board 20, the ICs 22 and 25, the R/C elements 26 and 27 and the optoelectronic element 21. A receptacle 23 with an axial opening is fitted at a front end of the circuit board 20. An end of an optical fiber 24 can be inserted into the receptacle 23.

The optoelectronic element 21 contains a set of a photo-diode (PD) and a preamplifier. The PD makes a photocurrent in proportion to signal light pulses (receiving signals) propagating via a fiber from a station. The preamplifier preliminarily amplifies the photocurrent of the PD, which is effective to suppress noise. The ICs 22 and 25 are allocated to a main amplifier IC, a waveform-modifying IC and a buffer IC. Short wires and short metallized patterns connect the PD to the ICs. The access of the PD to the ICs ensures excellent high frequency performance for the PD module.

FIG. 8 and FIG. 9 show a plan view and a vertically sectioned view for clarifying the optoelectronic (PD) element of Embodiment 2. The optoelectronic element 21 makes use of a silicon bench 33 as a base for passive alignment. The silicon bench 33 is a single crystal having a (100) orientation surface. A larger V-groove and a smaller V-groove are serially dug along a center line on the silicon bench 33 by anisotropic chemical etching. Marks are engraved at spots at which a PD 34 and an IC 35 are placed on the surface of the silicon bench 33. Wiring metallized patterns are formed on the silicon bench 33 by printing, evaporation or sputtering. The PD chip 34 and the preamplifier IC chip 35 are die-bonded on the marked spots along an extension of the center line of the V-grooves. A ferrule 37 and a fiber 36 are embedded in the larger V-groove and the smaller V-groove. Light emanating from the fiber 36 enters the PD 34. In the case of a front end incidence type PD, the light emitted from the fiber 36 directly goes into the front of the PD 34. In the case of a bottom incidence type PD, an intermediate groove with a slanting reflecting wall at an end is formed between the fiber end and the PD. The light emitted from the fiber is reflected by the slanting reflecting wall and is guided via the bottom into the PD.

A transparent resin covers the fiber and the PD for protecting the PD and the fiber end and for reducing reflection loss. A PLC type PD element is prepared.

The optoelectronic (PD) element 21 is fitted upon a forward part of the circuit board 20 as shown in FIG. 4 and FIG. 5. The receptacle 23 with a hole is attached at the front of the circuit board 20. The case 38 encapsulates the circuit board 20, the ICs 22 and 25, the R/C elements, and the PD element 21. The inner space of the case 38 can be filled with an inert gas (argon gas, nitrogen gas and so on) or a resin for protecting the elements against humidity, oxidization and contamination. Embodiment 2 fills the case 38 with a resin.

Embodiments 1 and 2 employ (100) silicon single crystals as the benches 28 and 33 for passive alignment between the fiber and the optoelectronic element. A mild tolerance of the PD-fiber alignment allows the optoelectronic elements to employ a ceramic plate, for example, an alumina ($Al_2O_3$) plate as the bench 28. The sizes and the shapes of the LD or the PD are arbitrary. The numbers of the ICs or the R/C elements are also optional.

Shrinkage of thickness has been believed to be a unique advantage of the PLC (planar lightguide circuit) type modules. This invention endows the PLC technique further with reductions of length and breadth besides thickness by allocating the elements to both the top surface and the bottom surface of the base circuit board. Exploitation of the bottom enables the modules of this invention to decrease the width and the length to nearly halves and to reduce the thickness a little in comparison to the Prior Art of FIG. 1 and FIG. 2.

Figure 2:
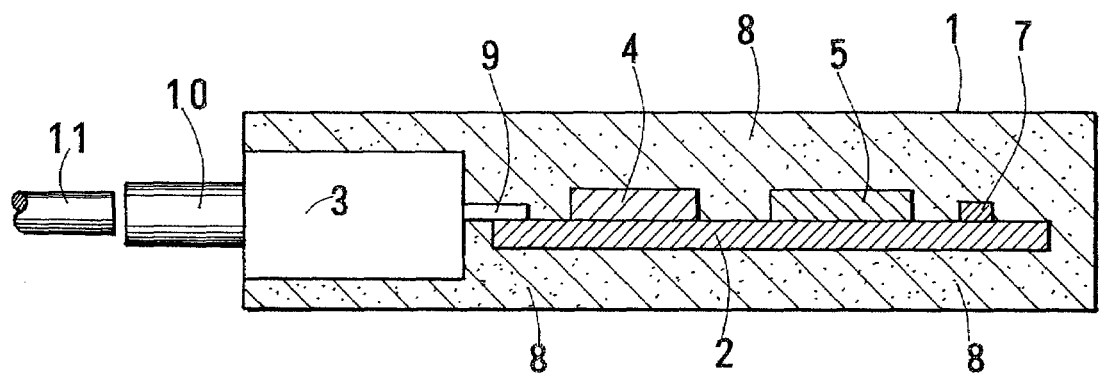
FIG. 2 is a vertically sectioned view of the known optical communication device produced by mounting a metallic-cased optoelectronic element, ICs, R/C elements on a print circuit board by soldering, and storing the circuit board with the parts in a package.

The Prior Art shown in FIG. 1 and FIG. 2 has a thickness of about 10 mm, since the metallic package of the optoelectronic element 3 has a large diameter of 7 mm to 8 mm. On the contrary, the present invention can reduce the thickness of the module to about 7 mm which is thinner than the thickness of the standardized optical connectors.

[Embodiment 3; Transmitting/receiving (LD/PD) Module; FIG. 10]

Paired transmitting/receiving (LD/PD) modules are of great use to optical communications. FIG. 10 shows Embodiment 3 as an LD/PD module. Like the Prior Art (LD/PD) of FIG. 11, Embodiment 3 pairs a transmitting (LD) part and a receiving (PD) part in parallel side by side.

As shown in FIGS. 4 and 5, the transmitting part includes a circuit board 20 with a top metallized patterns and bottom metallized patterns, an LD element 21 and a first IC 22 laid upon the top of the circuit board 20, and a second IC 25 and R/C elements 26 and 27 fitted on the bottom of the circuit board 20. The LD element 21 has an LD and a monitoring PD as depicted in FIG. 6 and FIG. 7. The ICs 22 and 25 indicate an LD driving IC, or an APC (auto power controlling) IC and so on.

The receiving part includes a circuit board 20' with top metallized patterns and bottom metallized patterns, a PD element 21' and a first IC 22' laid upon the top of the circuit board 20', a second IC 25' and R/C elements 26' and 27' fitted on the bottom of the circuit board 20'. The PD element 21' contains a PD and a preamplifier IC as depicted in FIG. 8 and FIG. 9. The ICs 22' and 25' indicate a main amplifier IC, a waveform-reforming IC, a timing adjusting IC, a buffer IC and so on.

Comparison of FIG. 10 (Embodiment 3) with FIG. 11 (Prior Art) clarifies an advantage of size-reduction of the present invention. The LD and PD parts (FIGS. 4 and 5) of Embodiment 3 are shorter than the LD and PD parts (FIGS. 1 and 2) of the Prior Art (FIG. 11). The LD/PD module (FIG. 10) of Embodiment 3 is shorter in length and narrower in breadth than the known LD/PD module (FIG. 11). The size-reduction brings about cost-reduction. Miniaturization gives another advantage which allows the present invention to employ a smaller optical connector with a narrower fiber-fiber interval than the Prior Art as shown in FIGS. 1, 2 and 3.

Figure 12:
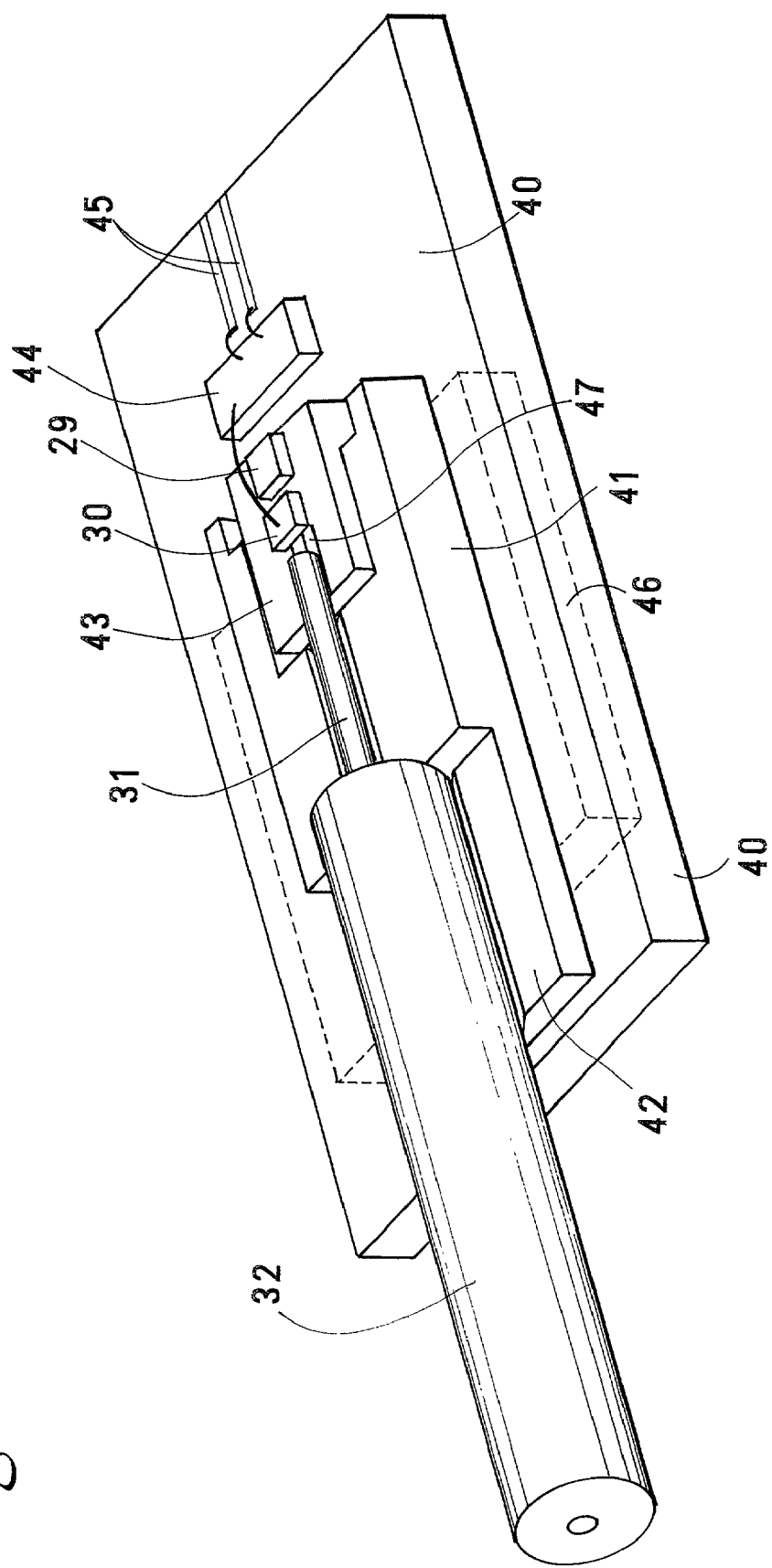
FIG. 12 is an oblique view of half-fabricated Embodiment 4 (LD module) having a circuit board with a top metallized surface and a bottom metallized surface, a submount having double V-grooves and being laid upon the circuit board, a silicon bench having a narrow V-groove and being loaded upon the submount, a ferrule imbedded in the V-groove of the submount, a fiber imbedded in the V-grooves of the submount and the silicon bench, an LD mounted upon the silicon bench, a monitoring PD lying behind the LD upon the silicon bench, an LD driving IC fitted upon the top of the circuit board, and an APC-IC fitted upon the bottom of the circuit board.

[Embodiment 4; LD module on silicon bench; FIGS. 12, 13, 14]

FIG. 12 is an oblique view of Embodiment 4 at an intermediate step of fabrication. Embodiment 4 includes an LD 30, a monitoring PD 29, an LD driving IC 44, and an APC-IC 46. Three different flat members are assembled for supporting the above elements for alleviating parts cost.

The supporting members are a wide, rectangular print circuit board 40, a liquid-crystal polymer submount 41 loaded upon a forward part of the circuit board 40, and a single crystal silicon bench 43 laid upon a rear cavity of the submount 41. The print circuit board 40 which is made of, e.g., epoxy has a top surface with metallized wiring patterns and a bottom surface with metallized wiring patterns. The submount 41 made of a liquid-crystal polymer has a forward lower step 42 with a larger V-groove, the rear cavity and a middle higher step with a narrower V-groove. The single crystal silicon bench 43 has a tiny V-groove 47 and marks for designating the spots for mounting an LD and a monitoring PD. The silicon bench 43 is inserted and fixed in the rear cavity of the submount 41. The three V-grooves align with each other on a straight axial line. The set of the V-grooves and the marks allows passive alignment for Embodiment 4. The expensive single crystal silicon bench 43 is the smallest among the three supporting members, which cuts down cost.

An optical fiber 31 is partially inserted in a ferrule 32. Front ends of the fiber 31 and the ferrule 32 are flat. The ferrule 32 is supported in the larger V-groove on the lower step 42 of the submount 41. The fiber 31 is supported by the smaller V-groove on the submount 41. A rear end of the fiber 31 is fixed in the V-groove 47 on the silicon bench 43. The LD 30 and the monitoring PD 29 are mounted in series at the marked spots on the silicon bench 43 along an extension of the axial line of the V-grooves.

Unlike the former embodiments, Embodiment 4 bases the optoelectronic element upon two different members, that is, the low-cost liquid-crystal polymer submount 41 and the high-cost silicon bench 43. Employment of the inexpensive submount 41 cuts down parts cost through economy of the silicon bench 43. What requires rigorous alignment is only the coupling between the fiber end and the LD 30. The small silicon bench 43 is sufficient for aligning the fiber end and the LD with high precision. The submount 41 contributes to adjustment of different heights for supporting the ferrule and the fiber.

Wiring patterns are printed upon the top surface and the bottom surface of the circuit board 40. An LD driving IC 44 which amplifies transmitting electric signals to driving current and gives the driving current to the LD is bonded on the pattern printed upon the top of the circuit board 40. Wires join an input signal pad, a source pad, and a ground pad of the LD driving IC 44 to metallized patterns 45 on the board 40. An output current pad of the LD driving IC 44 is connected via a wire to an electrode of the LD 30. An APC (Auto Power Controlling) IC 46 and other ICs are furnished on the bottom metallized patterns of the circuit board 40. In FIG. 12, the full length from the front of the ferrule 32 to the back end of the circuit board 40 is nearly 15 mm. The breadth of the circuit board 40 is about 5 mm.

The circuit board 40 has a card edge part 51 which is an assembly of parallel lead patterns for joining the inner electrical circuits to an external connector. The fiber end, the LD 30 and the PD 29 are partially incrusted with a transparent resin 48. Another protecting resin 49 covers the LD driving IC 44 and the APC-IC 46. Further, a resin package 50 covers these resins, the fiber 31, the ferrule 32, and the board 40.

FIG. 13 is the section of the resin-molded LD module of Embodiment 4. The transparent soft resin 48 is supplied to a space including the fiber end, the LD 30, and the monitor PD 29 for decreasing reflection. The transparent resin 48 is, for example, a transparent silicone type resin having a refractive index akin to the fiber. The soft protecting resin 49 encircles the LD driving IC 44 and the APC-IC 46 for absorbing external shock. An edge of the ferrule 32 is incased into an axial hole of a receptacle 23. Embodiment 4 is completed further by transfermolding the resin-coated sample in a metallic mould with a hard resin. FIG. 14 shows an appearance of completed Embodiment 4.

Actual steps of fabrication are described in detail as follows.

A (100) oriented silicon single crystal wafer of a 1 mm thickness is prepared. Small V-grooves 47 are dug on the silicon wafer by anisotropic etching. Metallized patterns and marks for mounting the LDs 30 and the PDs 29 are produced upon the silicon wafer by evaporation and photolithography. The silicon wafer is divided into a number of individual rectangular silicon benches having a 1.5 mm width, a 2.0 mm length and a 1 mm thickness.

A print circuit board 40 is prepared. Wiring metallized patterns are formed on the top surface and on the bottom surface of the print circuit board 40. An LD driving IC 44 is bonded upon the top surface and an APC-IC 46 is loaded on the bottom surface of the circuit board 40.

A liquid crystal polymer submount having a front step and a rear cavity is prepared. The LC-polymer submount has a 3.5 mm breadth, a 6.0 mm length and a 1.0 mm thickness. The submount 41 is glued on the top surface of the circuit board 40 in front of the LD-driving IC 44 with an epoxy resin adhesive. The silicon bench 43 is glued with an adhesive in the back cavity of the submount 41. The circuit board 40 supports the submount 41 which sustains the silicon bench 43.

The prepared LD chip has a 300 μm width, a 300 μm length and a 120 μm thickness. The prepared monitoring PD (MPD) has a 400 μm width, a 400 μm length and a 200 μm thickness. The LD 30 and the MPD 29 are soldered at the spots denoted by the marks on the metallized patterns on the silicon bench 43. The monitoring PD (MPD) monitors the power of the LD by sensing rear emitted LD light. The PD is either a bottom incidence type or a front end incidence type. In the case of a bottom incidence type PD, an intermediate groove with a slanting reflecting wall is dug between the LD 30 and the PD 29. Light emanating backward from the LD 30 is reflected by the slanting reflecting wall and is guided into the PD via the bottom. In the case of a front-end incidence type PD, light emitted from the LD 30 goes directly into the front end of the PD 29.

A tail of a fiber 31 is inserted into the narrow V-groove of the silicon bench 43. The fiber 31 is imbedded in the smaller V-groove of the submount 41. A ferrule 32 is laid in the larger V-groove on the lower step of the submount 41. The fiber and the ferrule are glued to the V-grooves with an adhesive.

Electrodes of the LD 30, the MPD 29, the IC 44 or other electric elements are joined to wiring patterns formed on the circuit board 40 by wire-bonding. Light paths between the fiber and the LD and between the LD and the MPD are encrusted with a transparent (silicone type) resin 48. The ICs 44 and 46 and other electric elements are incrusted with a soft, insulating (silicone type) resin 49.

In the case of making a single LD module, a receptacle 23 is fitted to the edge of the ferrule 32 and a plastic package 50 is made by transfermolding the sample in a metallic mould with an epoxy resin. This example assigns an electric interface to the card edge part 51 which is an assemble of parallel metallized patterns projecting backward for sizing down the width. In the case of allowing extra margins on sides, the electric interface can be assigned to side leads as shown in FIG. 14, which is called a "gull wing" type.

An optical interface can be allocated with either the ferrule 32 or the receptacle 23 capping the ferrule 32.

Embodiment 4 shown in FIGS. 12, 13 and 14 has measure of a 12.7 mm length(L), a 4.0 mm thickness(H) and a 6.0 mm width (W) (12.7 mmL×4.0 mmH×6.0 mmW). The known module shown in FIGS. 1 and 2 having the same operation as this invention has a size of 25.4 mmL×9 mmH×9 mmW.

The present invention succeeds in sizing down a length as short as half of the known module. The surface area of Embodiment 4 is reduced to 1/4.5 of the Prior Art. The volume is further decreased to 1/6.75 of the Prior Art, which indicates immense miniaturization of optoelectronic devices. Vast size-down brings about conspicuous effects of suppressing floating capacitance, reducing inductance of wirings, shielding noise and improving high frequency performance.

[Embodiment 5; Receiving (PD) Module Based Upon Silicon Bench; FIG. 15]

FIG. 15 shows a PD module as Embodiment 5 of the present invention. FIG. 15 for Embodiment 5 (PD) resembles FIG. 12 of Embodiment 4 (LD). Embodiment 5 is obtained from Embodiment 4 by replacing the LD by a PD, the LD-driving IC by a preamplifier, the APC-IC by a main amplifier (including waveform-regulating IC, a timing adjusting IC and a buffer IC).

Embodiment 5 is a PD module having a PD 34, a preamplifier 35, a main amplifier 53 and so on.

Embodiment 5 has a similar supporting structure including a print circuit board 40, a submount 41 and a silicon bench 43. The circuit board 40 is a rectangular resin plate having metallized wiring patterns on the top surface and other metallized wiring patterns on the bottom surface. The submount 41 which is made of a liquid crystal polymer has a lower front step 42 and a larger V-groove on the front step, a smaller V-groove on the middle plateau and a back cavity 39. The submount 41 is glued to a forward part of the circuit board 40. The silicon bench 43 has a narrow V-groove, marks for showing a spot of putting a PD, and metallized patterns. The narrow V-groove has a slanting reflection wall at an end. The silicon bench 43 is fixed in the rear cavity 39 of the submount 41. A end of an optical fiber 36 is inserted into a ferrule 37. The ferrule 37 is pillowed on the larger V-groove on the lower step 42. The fiber 36 is fitted upon the smaller V-groove on the submount 41. The end of the fiber 36 is loaded on the V-groove of the silicon bench 43. The ferrule 37 and the fiber 36 are fixed by an adhesive. The PD 34 is mounted upon a metallized pattern on the silicon bench 43. The PD 34 is a bottom incidence type. Light emanating from the fiber 36 is reflected by the slanting reflection wall and is guided up to the bottom of the PD 34. Instead of the bottom incidence type, a front end incidence type PD is also available.

The print circuit board 40 has wiring metallized patterns on both surfaces. The preamplifier IC 35 is bonded upon the metallized pattern. An output signal electrode, a source electrode, a ground electrode of the preamplifier 35 are connected to wiring patterns 54 on the circuit board 40 by wires. An input electrode of the preamplifier 35 is joined to a top electrode of the PD 34 by a wire. The main amplifier IC 53 (including a waveform-reforming IC and a timing regulating IC and a buffer IC) is fitted on a metallized pattern on the bottom.

In FIG. 15, the length from the front end of the ferrule 37 to the back end of the circuit board 40 is about 15 mm. The breadth of the circuit board 40 is about 5 mm. The measure is similar to Embodiment 4. A transparent soft resin is supplied to a space between the fiber end and the PD 34. Another soft resin is given to the preamplifier 35 and the main amplifier 53 for protecting the ICs. The end of the ferrule 37 is sheathed with a receptacle. A plastic package is made by transfermolding the sample in a metallic mould with an epoxy resin.

Embodiment 5 (FIG. 15) is as short as half of the Prior Art of FIGS. 1 and 2. The area of Embodiment 5 is reduced to about 1/4 of the Prior Art. The volume is decreased to about 1/6 of the Prior Art. Size-reduction cuts down parts cost of the LD, PD and LD/PD modules. Miniaturization raises noise resistance, high frequency performance and reliability of the LD, PD or LD/PD modules.

Figure 16:
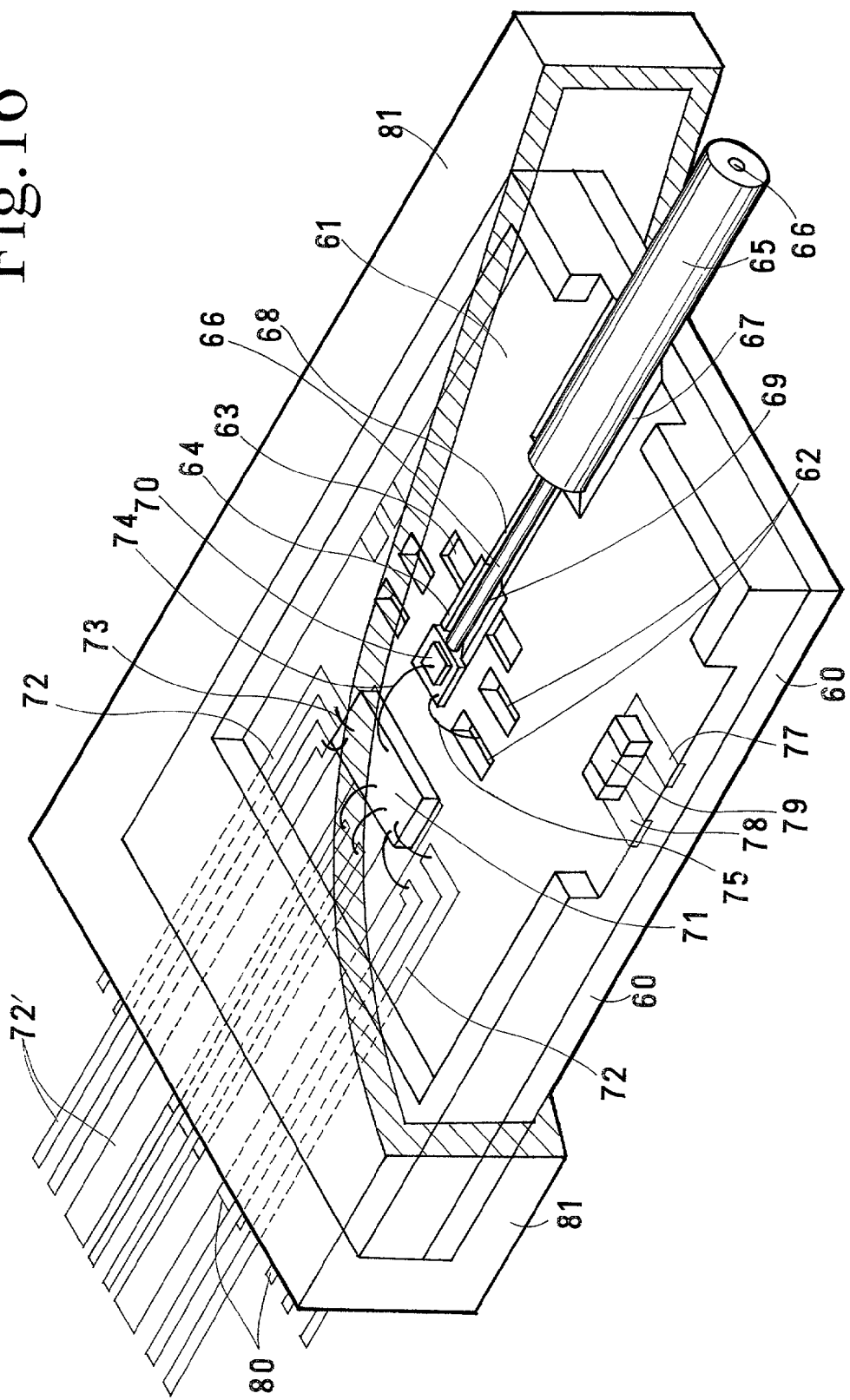
FIG. 16 is a partially sectioned perspective view of completed Embodiment 6 having a circuit board with a top metallized surface and a bottom metallized surface, a submount having double V-grooves and being loaded upon the top surface of the circuit board, a ferrule and a fiber embedded in the V-grooves of the submount, a silicon bench laid upon the submount, an LD mounted upon the silicon bench, an LD driving IC placed upon the top of the submount, R/C elements fitted upon the top of the submount, an APC-IC fitted upon the bottom of the circuit board, an upper set of leadpins fitted to the metallized patterns formed upon the submount, a lower set of leadpins brazed to the metallized patterns formed on the bottom of the circuit board, and a package encapsulating the circuit board, the submount, the silicon bench and other elements.

[Embodiment 6; Two-storied Leadpins, LD Module; FIG. 16]

The circuit board has a set of wiring metallized patterns on the top surface and another set of different wiring metallized patterns on the bottom surface.

The preceding embodiments has a set of leadpins extending outward from the back (tail-pin type) or from the sides (gull-wing type) at the same height of the circuit board. The patterns are unified by connecting the top surface patterns to the bottom surface patterns by vertical throughholes. Then, the unified patterns are joined to the leadpins which are all at the same level.

Embodiment 6 gives independent, inherent sets of leadpins to the top and bottom metallized patterns by making two-storied sets of the leadpins. An upper set of the leadpins is allotted to the metallized patterns on the top surface of the circuit board. A lower set of the leadpins is allocated to the metallized patterns on the bottom surface of the circuit board. The upper leadpins are brazed or soldered to the corresponding metallized patterns on the top. The lower leadpins are brazed or soldered to the corresponding metallized patterns on the bottom.

FIG. 16 shows a transmitting (LD) module as Embodiment 6. A print circuit board 60 has a top surface with wiring metallized patterns and a bottom surface with other wiring metallized patterns. Holes for soldering pins are perforated on some portions of the wiring patterns. A submount 61 which is made of a resin, e.g., a liquid crystal polymer is installed on the top surface of the print circuit board 60. The submount 61 has holes, cavities, grooves, protrusions and metallized patterns. Since the submount 61 is made by molding in a metallic mould with a material resin, any complex holes, protrusions or grooves can be shaped at a stroke. The holes include wiring holes 62 and keeping holes 63. An assemble of two or three submounts can realize far complicate shapes. A tiny silicon bench 64 is incased into a central cavity.

An optical guide is an optical fiber 66 partially embraced by a ferrule 65. The submount 61 has prepared a larger V-groove 67 at the forward region for retaining the ferrule 65. A shallow V-groove 68 follows the large V-groove 67 in series for sustaining the fiber 66. The silicon bench 64 has a shallow V-groove 69 succeeding the V-groove 68 of the submount 61. The silicon bench 64 has marks for an LD 70 and the V-groove 69 for LD/fiber passive alignment. The passive alignment of the silicon bench 64 allows the submount 61 wide tolerances of the V-grooves 68 and 67.

The laser diode (LD) 70 is bonded on a metallized pattern on the silicon bench 64 along an extension of the fiber 66 under a guidance of the marks. The laser diode (LD) 70 generates transmitting light signals from transmission electric signals. The LD signal light enters the optical fiber 66 for propagating via external media to a partner unit (subscriber or station).

Embodiment 6 omits a monitoring photodiode (MPD) which used to be provided behind the LD for monitoring the power of the LD. Embodiment 6 places an LD-driving IC 71 at the back of the laser diode 70. The LD-driving IC 71 amplifies electric signals to be transmitted and gives signal current to the laser diode 70.

The submount 61 has also a set of metallized patterns 72 for wiring the LD, the IC, R/C elements to external leadpins. Electrode pads of the LD-driving IC 71 are joined to the metallized patterns 72 by wires 73. An electrode pad of the LD-driving IC 71 is connected to a top pad of the laser diode 70 with a wire 74. The pattern beneath the laser diode 70 is joined with another wire 75 via a hole 62 to a wiring pattern on the circuit board 60. The submount 61 has metallized patterns 77 and 78 for soldering an R/C element 79.

Electronic elements and electric elements are bonded on other metallized patterns of the bottom of the circuit board. An APC (auto power controlling) IC is omitted, since Embodiment 6 lacks the monitoring PD. Other ICs and R/C elements are provided upon the bottom patterns of the circuit board.

What characterizes Embodiment 6 is two-storied structure of leadpins. A set of lower leadpins 80 extends backward from the bottom of the circuit board 60 as shown in FIG. 16. The lower leadpins 80 are brazed or soldered to the bottom metallized patterns formed on the bottom of the circuit board 60. Another set of higher leadpins 72' extends backward from the top surface of the submount 61 having the metallized patterns. The higher leadpins 72' are brazed or soldered to the top metallized patterns formed on the submount 61. The higher leadpins 72' and the lower leadpins 80 build a two-storied leadpins structure. The LD-driving IC requires ten to twenty leadpins. Size-down deprives the modules of margins for the leadpins. Narrow ends or sides restrict the number of the leadpins. The two-storied structure allows modules a new, extra space for the leadpins. The top surface of the circuit board beneath the submount also has wiring metallized patterns. They are a middle group of the patterns. If a third set of the leadpins is allotted to the middle group of the patterns on the top surface of the circuit board, three-storied leadpin structure will be realizes. The two-storied or three-storied leadpin structure enriches modules with increment of the leadpins.

We claim:

1. An optical communication device comprising:
    a circuit board having a top surface and a bottom surface;
    a bench mounted on the top surface of the circuit board;
    a laser diode (LD) chip mounted on the bench for generating transmitting light signals;
    a monitoring photodiode (PD) chip mounted on the bench for monitoring power of the laser diode;
    light guides aligned with the laser diode on the bench for guiding light signals from the laser diode;
    an LD-driving IC mounted upon the top surface of the circuit board for amplifying transmitting electric signals and giving amplified signal current to the laser diode (LD);
    an auto power controlling (APC) IC mounted upon the bottom surface of the circuit board for controlling the power of the laser diode in accordance with the power sensed by the monitoring photodiode; and
    electric elements mounted on the bottom surface of the circuit board, at least one of the electric elements being just below the bench,
    wherein the light guide is an optical fiber with a ferrule,
    wherein the bench has a larger V-groove for supporting the ferrule on a lower step, and a smaller V-groove for sustaining the fiber, and marks designating a spot of the laser diode (LD) for aligning the laser diode to the optical fiber, and
    wherein one of the electric elements on the bottom or the APC IC is mounted below and in opposition to the LD chip through the circuit board and the bench.

2. The optical communication device according to claim 1, wherein the bench has marks designating a spot of mounting the monitoring photodiode (PD).

3. The optical communication device according to claim 1, wherein the monitoring photodiode (PD) is a bottom incidence type PD and the monitoring photodiode (PD) and the laser diode (LD) are coupled by a groove.

4. The optical communication device according to claim 1, wherein the ferrule is capped with a receptacle for coupling to an external optical connector.

5. The optical communication device according to claim 1, wherein the bench is a single crystal silicon bench, and the larger V-groove and the smaller V-groove are made on the silicon bench by anisotropic chemical etching.

6. The optical communication device according to claim 1, wherein the electric elements mounted on the bottom surface of the circuit board are R/C elements which are either resistors or capacitors.

7. The optical communication device according to claim 6, wherein the top surface of the circuit board has a set of outward extending leadpins which are connected to wiring metallized patterns formed on the top surface and the bottom surface of the circuit board has another set of outward extending leadpins which are connected to wiring metallized patterns formed on the bottom surface.

8. An optical communication device comprising:
    a circuit board having a top surface and a bottom surface;
    a bench mounted on the top surface of the circuit board;
    a photodiode (PD) chip mounted on the bench for receiving light signals;
    light guides aligned with the photodiode on the bench for guiding the receiving signals to the photodiode;
    a preamplifier-IC mounted upon the top surface of the circuit board for preamplifying the signals of the photodiode;
    at least one of a waveform-reforming IC, a timing-adjusting IC, and a buffer IC mounted upon the bottom surface of the circuit board; and
    electric elements mounted on the bottom surface of the circuit board,
    wherein the light guide is an optical fiber with a ferrule,
    wherein the bench has a larger V-groove for supporting the ferrule on a lower step, a smaller V-groove for sustaining the fiber, and marks designating a spot of the photodiode (PD) for aligning the photodiode to the optical fiber, and
    wherein one of the electric elements on the bottom, the waveform reforming IC, the timing-adjusting IC or the buffer IC is mounted below and in opposition to the PD chip through the circuit board and the bench.

9. The optical communication device according to claim 8, wherein the bench has marks designating a spot of mounting the preamplifier IC.

10. The optical communication device according to claim 8, wherein the photodiode (PD) is a bottom incidence type PD and the photodiode (PD) is coupled to the optical fiber by the smaller V-groove with a reflection plane.

11. The optical communication device according to claim 8, wherein the ferrule is capped with a receptacle for coupling to an external optical connector.

12. The optical communication device according to claim 8, wherein the bench is a single crystal silicon bench, and the larger V-groove and the smaller V-groove are made on the silicon bench by anisotropic chemical etching.

13. The optical communication device according to claim 8, wherein the electric elements mounted on the bottom surface of the circuit board are R/C elements which are either resistors or capacitors.

14. The optical communication device according to claim 13, wherein the top surface of the circuit board has a set of outward extending leadpins which are connected to wiring metallized patterns formed on the top surface, and the bottom surface of the circuit board has another set of outward extending leadpins which are connected to wiring metallized patterns formed on the bottom surface.

15. An optical communication device comprising:
an LD module;
a PD module;
a package encasing a pair of the LD module and the PD module;
the LD module including:
a first circuit board with a top surface and a bottom surface;
an LD driving IC mounted upon the top surface of the first circuit board;
an auto power controlling (APC) IC mounted upon the bottom surface of the first circuit board;
a first silicon bench fitted upon the top surface of the first circuit board;
an LD chip and a monitoring PD chip mounted on the first silicon bench;
an end of an optical fiber sustained by the silicon bench; and
a ferrule incasing another end of the fiber and being retained by the first silicon bench, the PD module comprising;
a second circuit board with a top surface and a bottom surface;
a first group of ICs mounted upon the top surface of the second circuit board;
a second group of ICs mounted on the bottom surface of the second circuit board;
a second silicon bench fitted upon the top surface of the second circuit board;
a PD chip mounted upon the second silicon bench for sensing light signals and generating photocurrent;
a preamplifier IC chip mounted upon the second silicon bench for preamplifying the photocurrent of the PD chip;
an optical fiber with an end sustained by the second silicon bench for guiding light signals to the PD chip; and
a ferrule incasing the other end of the fiber and being retained by the second silicon bench
wherein the auto power controlling (APC) IC is mounted on the first circuit board below and in opposition to the LD chip through the first circuit board and the first silicon bench, and
wherein at least one IC of the second group of IC's is mounted on the second circuit board below and in opposition to the PD chip through the second circuit board and the second silicon bench.

16. The optical communication device according to claim 15, wherein the first group of ICs mounted on the top surface of the second circuit board is a main amplifier IC for amplifying the preamplified current.

17. The optical communication device according to claim 16, wherein the second group of ICs mounted on the bottom surface of the second circuit board are a waveform-reforming IC, a timing-adjusting IC and a buffer IC.

* * * * *